(12) United States Patent
Hoang et al.

(10) Patent No.: US 7,956,696 B2
(45) Date of Patent: Jun. 7, 2011

(54) TECHNIQUES FOR GENERATING FRACTIONAL CLOCK SIGNALS

(75) Inventors: Tim Tri Hoang, San Jose, CA (US); Wilson Wong, San Francisco, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/234,114

(22) Filed: Sep. 19, 2008

(65) Prior Publication Data

US 2010/0073094 A1    Mar. 25, 2010

(51) Int. Cl.
*H03L 7/085* (2006.01)
*H03B 19/00* (2006.01)

(52) U.S. Cl. .................. 331/25; 327/156; 327/117

(58) Field of Classification Search .......... 331/1 R, 331/16, 1 A, 25; 327/156, 115, 117; 377/48
See application file for complete search history.

(56) References Cited

U.S. PATENT DOCUMENTS

| | | | |
|---|---|---|---|
| 5,202,906 A | | 4/1993 | Saito et al. |
| 6,466,073 B1 * | | 10/2002 | Yukinari et al. ............. 327/291 |
| 6,603,360 B2 | | 8/2003 | Kim et al. |
| 6,710,664 B2 | | 3/2004 | Humphreys et al. |
| 6,734,740 B1 * | | 5/2004 | Green et al. .................... 331/25 |
| 6,914,464 B2 * | | 7/2005 | Maeda ........................ 327/156 |
| 6,914,490 B2 | | 7/2005 | Fayneh et al. |
| 7,205,848 B2 | | 4/2007 | Cordos et al. |
| 7,274,229 B1 | | 9/2007 | Humphreys et al. |
| 7,405,629 B2 | | 7/2008 | Li |
| 2008/0008284 A1 | | 1/2008 | Huang et al. |
| 2009/0072912 A1 * | | 3/2009 | Kim et al. ........................ 331/16 |

OTHER PUBLICATIONS

Korean Intellectual Property Office, International Search Report and Written Opinion of the International Searching Authority for patent application PCT/US2009/056753, mailed Apr. 12, 2010.

* cited by examiner

*Primary Examiner* — Robert Pascal
*Assistant Examiner* — Ryan Johnson
(74) *Attorney, Agent, or Firm* — Steven J. Cahill

(57) ABSTRACT

A circuit includes phase detection circuitry, a clock signal generation circuit, a first frequency divider, and a second frequency divider. The phase detection circuitry compares an input clock signal to a feedback signal to generate a control signal. The clock signal generation circuit generates a periodic output signal in response to the control signal. The first frequency divider divides a frequency of the periodic output signal by a first value to generate a first frequency divided signal. The second frequency divider divides the frequency of the periodic output signal by a second value to generate a second frequency divided signal. The first and the second frequency divided signals are routed to the phase detection circuitry as the feedback signal during different time intervals.

23 Claims, 5 Drawing Sheets

US 7,956,696 B2

TECHNIQUES FOR GENERATING FRACTIONAL CLOCK SIGNALS

BACKGROUND OF THE INVENTION

The present invention relates to electronic circuits, and more particularly, to techniques for generating fractional clock signals.

Locked loop circuits such as delay-locked loop circuits and phase-locked loop circuits can be used to generate clock signals.

BRIEF SUMMARY OF THE INVENTION

Some embodiments of the present invention include phase detection circuitry, a clock signal generation circuit, a first frequency divider, and a second frequency divider. The phase detection circuitry compares an input clock signal to a feedback signal to generate a control signal. The clock signal generation circuit generates a periodic output signal in response to the control signal. The first frequency divider divides a frequency of the periodic output signal by a first value to generate a first frequency divided signal. The second frequency divider divides the frequency of the periodic output signal by a second value to generate a second frequency divided signal. The first and the second frequency divided signals are routed to the phase detection circuitry as the feedback signal during different time intervals. The present invention includes circuits, systems, and methods for performing the techniques described herein.

Various objects, features, and advantages of the present invention will become apparent upon consideration of the following detailed description and the accompanying drawings.

DETAILED DESCRIPTION OF THE INVENTION

Figure 1:
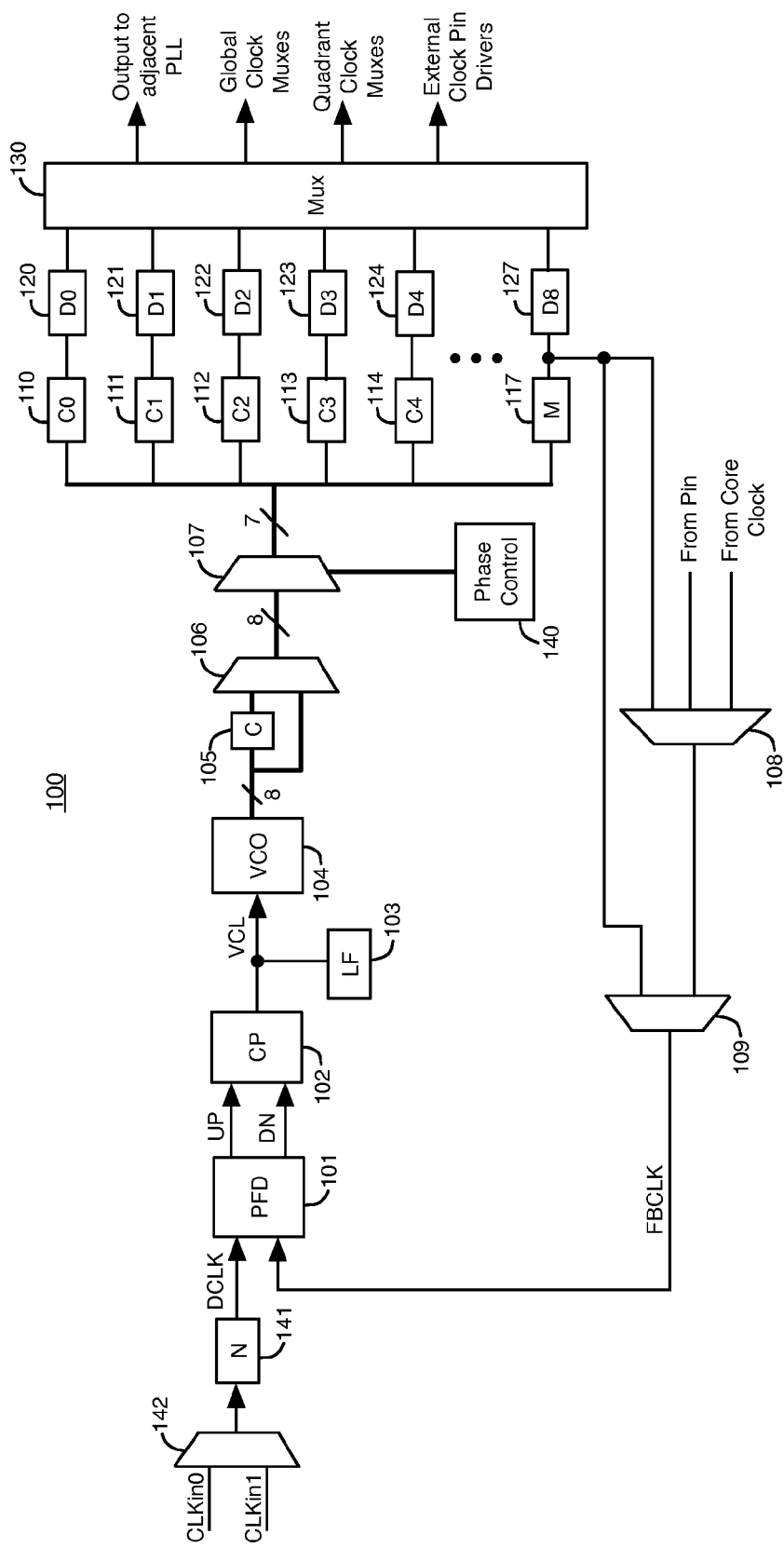
FIG. 1 illustrates an example of a phase-locked loop (PLL) circuit.

FIG. 1 illustrates an example of a phase-locked loop (PLL) circuit 100. PLL 100 includes phase frequency detector (PFD) 101, charge pump (CP) 102, loop filter (LF) 103, voltage-controlled oscillator (VCO) 104, frequency divider circuits 105, multiplexers 106, multiplexer 107, multiplexers 108-109, frequency divider circuit 141, multiplexer 142, frequency divider circuits 110, 111, 112, 113, 114, . . . 117, delay circuits 120, 121, 122, 123, 124, . . . 127, multiplexer 130, and phase control block 140.

Multiplexer 142 transmits one of two input reference clock signals CLKin0 and CLKin1 to an input terminal of N frequency divider circuit 141. The reference clock signals CLKin0 and CLKin1 are periodic input signals. Frequency divider 141 generates an output clock signal DCLK in response to the reference clock signal transmitted from multiplexer 142. Frequency divider 141 divides the frequency of the reference clock signal by a frequency division value N to generate the frequency of output clock signal DCLK.

The divided clock signal DCLK is transmitted to a first input terminal of phase frequency detector (PFD) circuit 101. PFD 101 compares the phase and the frequency of clock signal DCLK to the phase and the frequency of a feedback clock signal FBCLK to generate pulses in UP and DN output signals.

The UP and DN signals are transmitted to input terminals of charge pump (CP) circuit 102. Charge pump (CP) 102 controls its output control voltage VCL in response to the UP and DN signals. The output voltage VCL of charge pump 102 is low pass filtered by loop filter (LF) circuit 103. CP 102 sends charge to loop filter 103 in response to high pulses in the UP signal. CP 102 drains charge from loop filter 103 in response to high pulses in the DN signal.

The output voltage VCL of LF block 103 is transmitted to an input terminal of voltage-controlled oscillator (VCO) circuit 104. VCO 104 is a 4-stage VCO generating 8 periodic output clock signals that are equally spaced 45 degrees apart from each other. The periodic output clock signals of VCO 104 are also referred to as periodic output signals. The 8 periodic output signals of VCO 104 have relative phase shifts of 0°, 45°, 90°, 135°, 180°, 225°, 270°, and 315°. One of the periodic output signals of VCO 104 feeds back to PFD 101 as the feedback clock signal FBCLK through multiplexers 106-107, feedback M divider 117, and multiplexer 109.

PFD 101 generates longer high pulses in the UP signal than in the DN signal when the frequency of clock signal DCLK is greater than the frequency of feedback clock signal FBCLK. When high pulses in the UP signal are longer than high pulses in the DN signal, CP 102 increases control voltage VCL, causing the frequency of the periodic output clock signals of VCO 104 to increase, which causes the frequency of the FBCLK signal to increase.

PFD 101 generates longer high pulses in the DN signal than in the UP signal when the frequency of feedback clock signal FBCLK is greater than the frequency of clock signal DCLK. When high pulses in the DN signal are longer than high pulses in the UP signal, CP 102 decreases control voltage VCL, causing the frequency of the periodic output clock signals of VCO 104 to decrease, which causes the frequency of the FBCLK signal to decrease.

VCO 104 varies the frequency of its periodic output signals in response to changes in the control voltage VCL, until clock signal DCLK and the feedback clock signal FBCLK are frequency and phase aligned. PLL 100 is in lock mode when clock signal DCLK and feedback clock signal FBCLK have the same frequency and phase. According to further embodiments, VCO 104 can be replaced with a current controlled oscillator.

Frequency divider block 105 represents 8 frequency divider circuits (e.g., counter circuits) that are coupled to receive the 8 periodic output signals of VCO 104. Frequency divider circuits 105 divide the frequency of the periodic output signals of VCO 104 by a frequency division value (e.g., 2) to generate 8 frequency divided output signals. Multiplexers 106 are coupled to VCO 104, frequency divider block 105, and multiplexer 107. Multiplexers 106 can be programmed to transmit the 8 frequency divided output signals of frequency divider block 105 to 8 input terminals of multiplexer 107. Alternatively, multiplexers 106 can be programmed to transmit the 8 periodic output signals of VCO 104 directly to the 8 input terminals of multiplexer 107. Multiplexers 106 represent 8 separate multiplexers, one for each of the 8 periodic output signals of VCO 104. Multiplexer 107 is an 8-to-7 multiplexer. Phase control state machine 140 controls the phases of the 7 periodic output clock signals of multiplexer 107.

Multiplexer 107 transmits 7 of the output clock signals of multiplexers 106 to 8 frequency divider circuits 110-114 . . . 117. PLL 100 can have any number of C output frequency dividers 110-114 . . . , in addition to M feedback frequency divider 117. Each of the N, C, and M frequency divider circuits 141, 110-114 . . . , and 117 can, for example, be implemented by a counter circuit. Each of the frequency divider circuits 110-117 receives one of the output clock signals of multiplexer 107. Frequency dividers 110-114 . . . 117 divide the frequency of the output clock signals received from multiplexer 107 by frequency division values C0-C4 . . . and M to generate frequency divided periodic output clock signals. Eight delay circuits 120-127 delay the frequency divided periodic output clock signals of the C and M frequency divider circuits 110-117. For example, delay circuits 120-124 and 127 delay the output clock signals of frequency dividers 110-114 and 117, respectively.

The output clock signals of delay circuits 120-127 are transmitted to input terminals of output multiplexer 130. Multiplexer 130 routes output clock signals from PLL 100 to various destinations on the integrated circuit chip that contains PLL 100. For example, output clock signals from PLL 100 can be routed to an adjacent PLL, global multiplexers, quadrant multiplexers, and external clock pin drivers.

The frequency divided output clock signal of feedback M frequency divider 117 is transmitted to input terminals of multiplexers 108 and 109. Multiplexer 108 selectively drives the output clock signal of frequency divider 117, a clock signal from the core circuitry of the integrated circuit, or a clock signal from a pin of the integrated circuit to an input terminal of multiplexer 109. Multiplexer 109 transmits the output clock signal of multiplexer 108 or the output clock signal of circuit 117 to the second input terminal of PFD 101. The output clock signal of multiplexer 109 is the feedback clock signal FBCLK.

The value of the charge pump current, the frequency division values of the M/N/C frequency divider circuits, and the resistor and capacitor values in loop filter 103 are carefully selected based on protocols, specifications, and user input frequencies to ensure that PLL 100 provides optimum performance, the lowest possible jitter, and stable operation.

The frequency $F_{OUT1}$ of the periodic output signals of VCO 104 is a function of the frequency $F_{IN}$ of the input reference clock signal received at the input terminal of divider 141, the frequency division value N of divider 141, and the frequency division value M of feedback divider 117, as shown below in equation (1).

$$F_{OUT1} = M \times \left(\frac{F_{IN}}{N}\right) \quad (1)$$

The frequency $F_{OUT2}$ of the periodic output signal of one of the C output dividers 110-114 is a function of the frequency $F_{IN}$ of the input reference clock signal received at the input terminal of divider 141, the frequency division value N of divider 141, the frequency division value M of feedback divider 117, and the frequency division value C of that particular C divider, as shown below in equation (2).

$$F_{OUT2} = \left(\frac{M}{C}\right) \times \left(\frac{F_{IN}}{N}\right) \quad (2)$$

PLL 100 is referred to as an integer-N PLL, because PLL 100 performs frequency multiplication to generate a desired output frequency. The frequency division value of N divider 141 defines the minimum output frequency step for each increase or decrease in the output frequency of PLL 100. For example, if $F_{IN}$ equals 50 MHz (fixed), the frequency division value N maximum setting is 100, the valid frequency range of VCO 104 is 100 MHz to 1 GHz, and the desired output frequency ranges from 900 MHz to 1 GHz, then 900 MHz< (50 MHz/100)×M<1 GHz, 1800<M<2000, with 500 KHz steps.

In many applications such as wireless communications, the desired frequency step is as small as 25 MHz for channel spacing. In order to generate an output frequency of 500.025 MHz in PLL 100 in response to an input reference clock signal having a frequency of 50 MHz, a frequency division value of N=2,000 is needed for frequency divider 141, a frequency division value of M=20,001 is needed for divider 117, and the frequency of clock signal DCLK at PFD 101 is 25 KHz.

Very large frequency division values of M and N can cause multiple issues in PLL 100. First, it may be impractical to create a large counter having a frequency division value of, e.g., 2,000-20,000, because the layout area of such a counter is very large. Second, large feedback (M) and input (N) counters can adversely affect the stability of PLL 100, including the output phase noise and jitter. The frequency of the input signal to PFD 101 is low (i.e., in the range of KHz) and is well within the PLL bandwidth. As a result, noise from PFD 101 is directly injected into VCO 104, and LF 103 is not able to filter out the noise.

According to some embodiments of the present invention, a fractional locked loop generates a periodic output clock signal by combining two different periodic clock signals that have two different frequencies. The fractional locked loop generates desired frequency steps (e.g. 25 KHz) without requiring a frequency divider that has an extremely large frequency division value. Various techniques of the present invention described herein can be implemented in locked loop circuits including phase-locked loops (PLLs) and delay-locked loops (DLLs).

Figure 2:
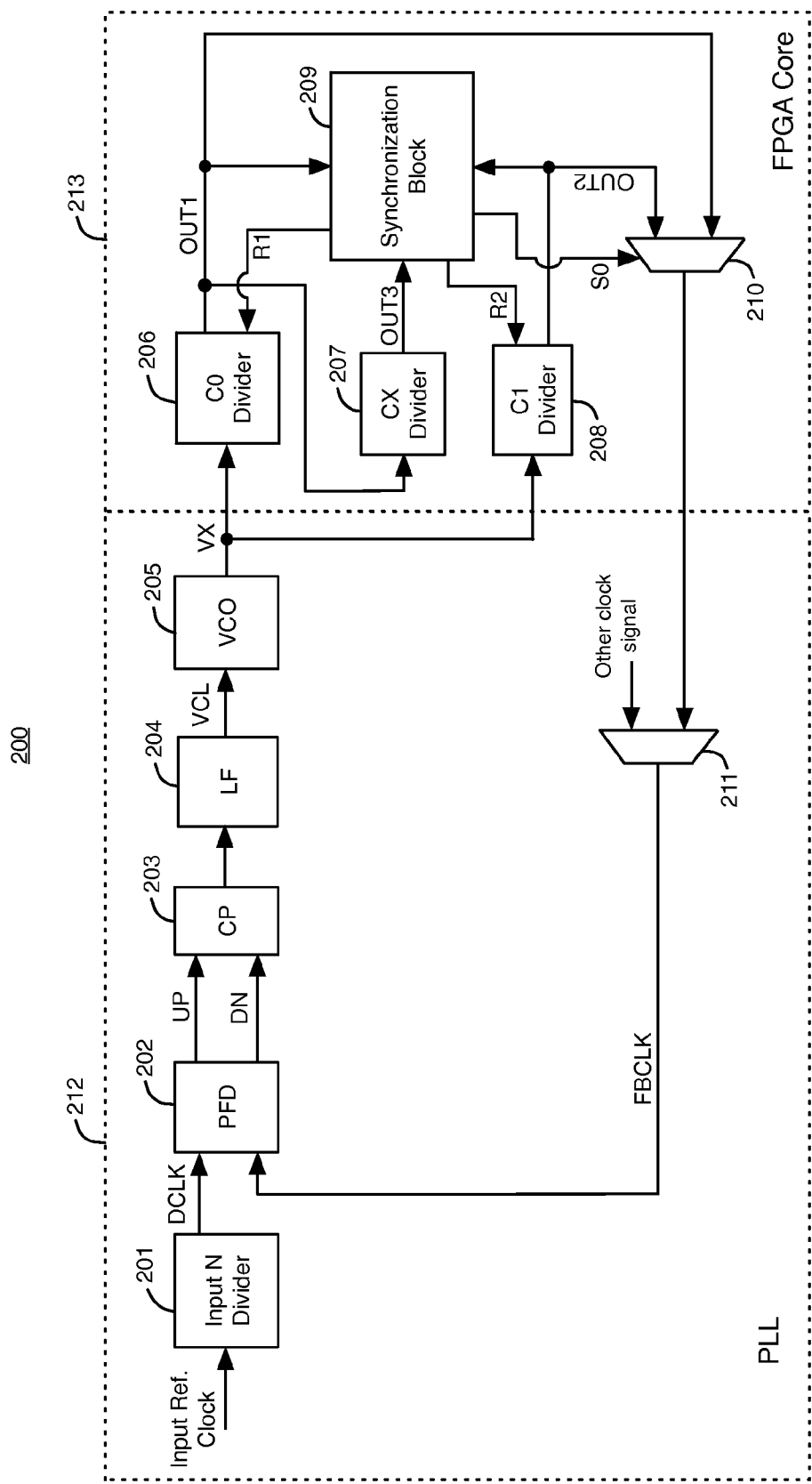
FIG. 2 illustrates an example of a phase-locked loop (PLL) circuit that can generate fractional periodic output signals by combining two different periodic feedback signals that have two different frequencies, according to an embodiment of the present invention.

FIG. 2 illustrates an example of a phase-locked loop circuit 200 that can generate fractional periodic output clock signals by combining two different periodic feedback clock signals having two different frequencies, according to an embodiment of the present invention. Phase-locked loop (PLL) circuit 200 includes input N frequency divider 201, phase frequency detector (PFD) 202, charge pump (CP) 203, loop filter (LF) 204, voltage-controlled oscillator (VCO) 205, C0 frequency divider 206, CX frequency divider 207, C1 frequency divider 208, synchronization block 209, and multiplexers 210-211. In some embodiments, frequency divider circuits 206-208 are counter circuits.

PLL 200 is typically fabricated on an integrated circuit. A PLL of the present invention can, for example, be fabricated on an application specific integrated circuit (ASIC) or on a programmable logic integrated circuit, such as a field programmable gate array (FPGA). PLL 200 can be fabricated, for example, on an FPGA. In PLL 200, the circuit elements in block 212 are implemented using non-programmable circuit elements that are located in a periphery of the FPGA. The circuit elements in block 212 include input N divider 201, phase frequency detector 202, charge pump 203, loop filter 204, voltage-controlled oscillator 205, and multiplexer 211. The circuit elements in block 213 are implemented using programmable circuit blocks that are located in a core region of the FPGA. The circuit elements in block 213 include C0 frequency divider 206, CX frequency divider 207, C1 frequency divider 208, synchronization block 209, and multiplexer 210. The programmable circuit blocks are configured during configuration mode to implement the functions of circuits 206-210. According to other embodiments, circuits 206-210 are implemented using non-programmable circuits.

Frequency divider 201 divides the frequency of a periodic input reference clock signal by a frequency division value N to generate clock signal DCLK, which is transmitted to an input terminal of PFD 202.

PFD 202 generates logic high pulses in the UP and DN signals in response to comparing a phase and frequency of signal DCLK to a phase and frequency of feedback clock signal FBCLK. Charge pump 203 and loop filter 204 convert the UP and DN signals into a control voltage VCL. Control voltage VCL controls the frequency of the periodic output clock signals of VCO 205. VCO 205 typically generates multiple periodic output clock signals, as described above with respect to VCO 104. The periodic output clock signals of VCO 205 are also referred to herein simply as periodic output signals. One periodic output signal VX of VCO 205 is transmitted to an input terminal of frequency divider circuit 206 and to an input terminal of frequency divider circuit 208. The frequency of the periodic output signals of VCO 205, including VX, varies in response to changes in the control voltage VCL.

PFD 202 generates longer high pulses in the UP signal than in the DN signal when the frequency of clock signal DCLK is greater than the frequency of periodic feedback clock signal FBCLK. When high pulses in the UP signal are longer than high pulses in the DN signal, CP 203 increases control voltage VCL, causing the frequency of the periodic output clock signals of VCO 205 (including VX) to increase, which causes the frequency of the FBCLK signal to increase. PFD 202 generates longer high pulses in the DN signal than in the UP signal when the frequency of periodic feedback clock signal FBCLK is greater than the frequency of clock signal DCLK. When high pulses in the DN signal are longer than high pulses in the UP signal, CP 203 decreases control voltage VCL, causing the frequency of the periodic output clock signals of VCO 205 (including VX) to decrease, which causes the frequency of the FBCLK signal to decrease.

Frequency divider circuit 206 generates a frequency divided periodic output clock signal OUT1 at an output terminal of circuit 206 in response to the output clock signal VX of VCO 205. Frequency divider circuit 206 divides the frequency of clock signal VX by a frequency division value C0 to generate the frequency of output clock signal OUT1. Frequency divider circuit 206 causes the frequency of signal VX divided by the frequency of signal OUT1 to be equal to C0.

Frequency divider circuit 208 generates a frequency divided periodic output clock signal OUT2 at an output terminal of circuit 208 in response to the output clock signal VX of VCO 205. Frequency divider circuit 208 divides the frequency of clock signal VX by a frequency division value C1 to generate the frequency of output clock signal OUT2. Frequency divider circuit 208 causes the frequency of signal VX divided by the frequency of signal OUT2 to be equal to C1.

According to some embodiments, frequency divider circuit 206 generates a frequency divided periodic output signal OUT1 that has a 50% duty cycle, and frequency divider circuit 208 generates a frequency divided periodic output signal OUT2 that has a 50% duty cycle. Frequency divider circuits 206 and 208 can be considered frequency multipliers, because placing frequency divider circuits 206 and 208 in the feedback loop of PLL 200 increases the frequency of the periodic output signals of VCO 205, including VX.

The first frequency divided periodic output signal OUT1 is transmitted from the output terminal of frequency divider circuit 206 to an input terminal of frequency divider circuit 207. Frequency divider circuit 207 generates a frequency divided periodic output clock signal OUT3 at an output terminal of circuit 207 in response to the output clock signal OUT1 of circuit 206. Frequency divider circuit 207 divides the frequency of clock signal OUT1 by a frequency division value CX to generate the frequency of output clock signal OUT3. Frequency divider circuit 207 causes the frequency of signal OUT1 divided by the frequency of signal OUT3 to be equal to CX.

Frequency division values C0, C1, and CX can be three different positive integer values.

In an embodiment, the output signal OUT3 of frequency divider circuit 207 has an adjustable duty cycle that can be programmed to a particular value and subsequently changed during the user mode of the FPGA. Frequency divider circuit 207 can be programmed with a fractional value that determines the duty cycle of signal OUT3. For example, frequency divider circuit 207 can generate a third frequency divided periodic output signal OUT3 that has a duty cycle equal to (CX−1)/CX, where the frequency of OUT1 divided by the frequency of OUT3 equals CX. In this embodiment, a logic high pulse in OUT3 in each period of OUT3 lasts for (CX−1) periods of OUT1, and a logic low pulse in OUT3 in each period of OUT3 lasts for 1 period of OUT1. In an embodiment, frequency divider circuit 207 is a counter circuit that increases a count value from zero to CX and then resets the count value to zero after the count value reaches CX.

The first frequency divided periodic output signal OUT1 is transmitted to a first input terminal of synchronization block 209. The second frequency divided periodic output signal OUT2 is transmitted to a second input terminal of synchronization block 209. The third frequency divided periodic output signal OUT3 is transmitted to a third input terminal of synchronization block 209.

Synchronization block 209 can be implemented using programmable logic blocks that are configured to function as a state machine. Synchronization block 209 generates three output control signals S0, R1, and R2 in response to the periodic signals OUT1, OUT2, and OUT3.

After the end of each period of periodic signal OUT1 (e.g., at each rising edge of OUT1 or at each falling edge of OUT1), synchronization block 209 generates a logic high pulse in a reset signal R1. The reset signal R1 is transmitted to a reset input terminal of divider circuit 206. After frequency divider circuit 206 receives the logic high pulse in the reset signal R1, frequency divider circuit 206 loads an initial count value of zero into a counter circuit in frequency divider circuit 206. Then, frequency divider circuit 206 adds one to the count value in each subsequent period of periodic signal VX starting from zero, until the count value of circuit 206 equals frequency division value C0. After the count value of circuit 206 reaches C0, circuit 206 has generated a full period of periodic output signal OUT1. Synchronization block 209 then generates another logic high pulse in reset signal R1, causing circuit 206 to again reset its count value to zero. Thus, C0 periods of VX occur during one period of OUT1.

After the end of each period of periodic signal OUT2 (e.g., at each rising edge of OUT2 or at each falling edge of OUT2), synchronization block 209 generates a logic high pulse in a reset signal R2. The reset signal R2 is transmitted to a reset input terminal of divider circuit 208. After frequency divider circuit 208 receives the logic high pulse in the reset signal R2, frequency divider circuit 208 loads an initial count value of zero into a counter circuit in frequency divider circuit 208. Then, frequency divider circuit 208 adds one to the count value in each subsequent period of periodic signal VX starting from zero, until the count value of circuit 208 equals frequency division value C1. After the count value of circuit 208 reaches C1, circuit 208 has generated a full period of periodic output signal OUT2. Synchronization block 209 then generates another logic high pulse in reset signal R2, causing circuit 208 to again reset its count value to zero. Thus, C1 periods of VX occur during one period of OUT2.

Synchronization block 209 generates a select signal S0. The select signal S0 is transmitted to a select input terminal of multiplexer 210. Periodic output signal OUT1 is transmitted from circuit 206 to a first multiplexing input terminal of multiplexer 210, and periodic output signal OUT2 is transmitted from circuit 208 to a second multiplexing input terminal of multiplexer 210.

Figure 3:
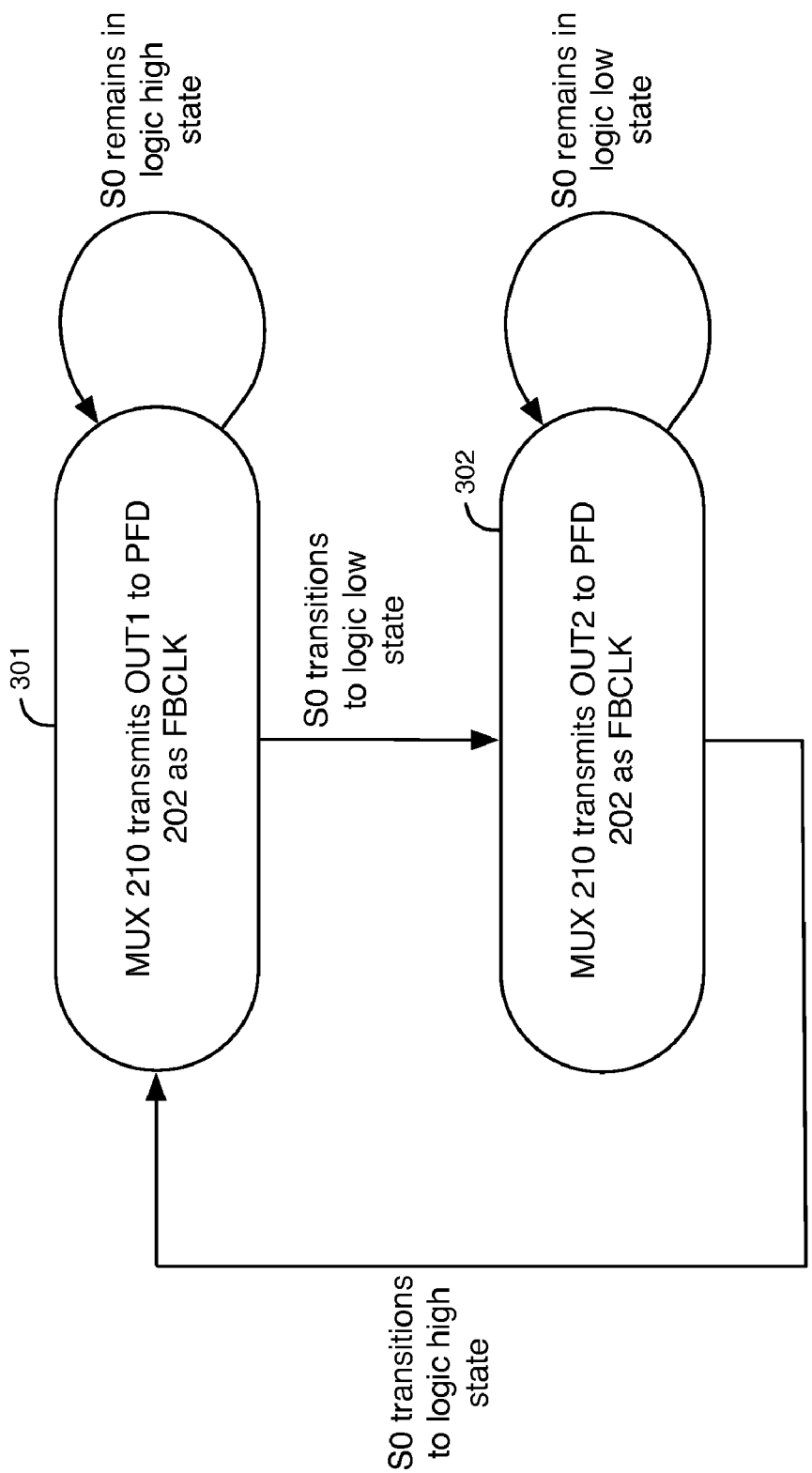
FIG. 3 is a state diagram that illustrates an example of the operation of a portion of the phase-locked loop of FIG. 2, according to an embodiment of the present invention.

FIG. 3 is a state diagram that illustrates an example of the operation of multiplexer 210 in response to the select signal S0, according to an embodiment of the present invention. In one embodiment, synchronization block 209 causes select signal S0 to have the same logic states as the periodic output signal OUT3 generated by divider circuit 207. Thus, when OUT3 is in a logic high state, S0 is also in a logic high state, and when OUT3 is in a logic low state, S0 is also in a logic low state.

In this embodiment, when S0 is a logic high in state 301 shown in FIG. 3, multiplexer 210 selects the periodic output signal OUT1 of frequency divider circuit 206, and multiplexers 210-211 transmit signal OUT1 from frequency divider circuit 206 to an input terminal of PFD 202 as the feedback clock signal FBCLK. When S0 is a logic low in state 302 shown in FIG. 3, multiplexer 210 selects the periodic output signal OUT2 of frequency divider circuit 208, and multiplexers 210-211 transmit signal OUT2 from frequency divider circuit 208 to an input terminal of PFD 202 as the feedback clock signal FBCLK. In this embodiment, multiplexer 211 is programmed to transmit the output signals of multiplexer 210 to PFD 202. In one embodiment, signal S0 is a re-synchronized version of signal OUT3 that prevents glitches in the output clock signal of multiplexer 210 when multiplexer 210 switches between clock signals OUT1 and OUT2.

The duty cycle and the period of select signal S0 determine when multiplexer 210 switches between transmitting signals OUT1 and OUT2 to PFD 202. For example, if the duty cycle of S0 is (CX−1)/CX, then multiplexers 210-211 transmit signal OUT1 as the feedback signal FBCLK for (CX−1) periods of OUT1 in each period of S0, and multiplexers 210-211 transmit signal OUT2 as the feedback signal FBCLK for 1 period of OUT1 in each period of S0.

Multiplexer 210 causes the instantaneous frequency of the feedback signal FBCLK as received at the second input terminal of PFD 202 to vary between the instantaneous frequency of signal OUT1 and the instantaneous frequency of signal OUT2. Multiplexer 210 causes the instantaneous frequency of feedback signal FBCLK to continuously vary between two different frequencies. Because the instantaneous frequency of FBCLK varies, phase-locked loop 200 continuously adjusts the instantaneous frequency of the periodic output signals of VCO 205 in an attempt to match the phase and the frequency of FBCLK with the phase and the frequency of input clock signal DCLK at PFD 202.

Thus, the instantaneous frequency of signal VX and the other periodic output signals of VCO 205 varies between the two different instantaneous frequencies of signals OUT1 and OUT2. Divider circuit 206 trains PLL 200 for X periods of OUT1 in each period of S0, and divider circuit 208 trains PLL 200 for Y periods of OUT1 in each period of S0 to generate the desired average frequency in the periodic output signals of VCO 205, including VX. The average frequency of signal VX and the other periodic output signals of VCO 205 is determined by the frequency division values C0, CX, and C1 of frequency divider circuits 206-208 and the duty cycle of select signal S0.

The duty cycle of select signal S0 can be changed to vary the average frequency of signal VX and the other periodic output signals of VCO 205. Also, frequency division values C0, C1, or CX can be changed to vary the average frequency of signal VX and the other periodic output signals of VCO 205. Frequency division values C0, C1, and CX can be programmable values.

The average period $P_{OUT}$ of the output signal VX of VCO 205 can be expressed using equation (3) below.

$$P_{OUT} = \left( \frac{(X \times P_1) + (Y \times P_2)}{X + Y} \right) \quad (3)$$

In equation (3), $P_1$ refers to the instantaneous period of output clock signal VX when OUT1 is transmitted to PFD 202 as FBCLK, and $P_2$ refers to the instantaneous period of output clock signal VX when OUT2 is transmitted to PFD 202 as FBCLK. X refers to the number of periods of signal OUT1 that occur when signal S0 is in a logic high state within a single period of S0. Y refers to the number of periods of signal OUT1 that occur when signal S0 is in a logic low state within a single period of S0. X+Y equals CX, the frequency division value of divider circuit 207. The average period $P_{OUT}$ of the periodic output signal VX of VCO 205 equals the period $P_1$ times a fractional value plus the period $P_2$ times a fractional value. Frequency divider circuits 206-208 implement the fractional values.

Because the frequency of the output clock signals of VCO 205 is an average frequency of two different instantaneous frequencies, the output clock signals of VCO 205 contain jitter. However, the duty cycle of select signal S0 and the frequency division values C0, C1, and CX can be selected to minimize the jitter in the output clock signals of VCO 205 to within an acceptable range.

The operation of PLLs 100 and 200 is now described using example numerical values. These example numerical values are provided for the purpose of illustration and are not intended to limit the scope of the present invention to these particular numerical values. If, for example, the frequency of the input reference clock signal of PLL 100 at the output terminal of multiplexer 142 is 50 MHz, the frequency division value N of frequency divider 141 equals 10, and the frequency division value M of frequency divider 117 equals 100, then the frequency $F_{OUT}$ of the output clock signals of VCO 104 equals 500 MHz, which corresponds to a period of 2 nanoseconds (ns). As another example, if the frequency of the input reference clock signal of PLL 100 equals 50 MHz, N=10, and M=101, then $F_{OUT}$=505 MHz, which corresponds to a period of 1.98 ns. The difference in the frequency between these two output clock signals is 5 MHz, which corresponds to a period of 200 ns.

PLL 200 can generate an output clock signal VX that has an average frequency of about 500.025 MHz when the frequency of the input reference clock signal of PLL 200 is 50 MHz, the frequency division value N of divider 201 equals 10, and the frequency of DCLK is 5 MHz. The frequency division value C0 of circuit 206 is set to 100, the frequency division value C1 of circuit 208 is set to 101, the frequency division value CX of circuit 207 is set to 198, and the duty cycle of select signal S0 is set to 197/198. Based on these example values, the numbers X=197, Y=1, $P_1$=2 ns, and $P_2$=1.98 ns are substituted into equation (3) to yield an average period of 1.9999 ns for the signal VX. Thus, the average frequency of the output clock signal VX equals the frequency of the input clock signal DCLK multiplied by a fractional value (i.e., a non-integer number) for a selected fixed frequency of DCLK (e.g., 5 MHz).

The duty cycle of select signal S0 can be set to (CX−1)/CX to generate an average period of 1.9999 ns for signal VX when the period $P_1$=2 ns, the period $P_2$=1.98 ns, CX=198, C0=100, and C1=101. In this example, synchronization block 209 causes multiplexer 210 to transmit OUT1 as the FBCLK signal while frequency divider circuit 206 counts from 1 to 100 197 times to generate 197 periods in OUT1. Then, synchronization block 209 resets frequency divider circuit 206 using signal R1. Block 209 causes multiplexer 210 to transmit OUT2 as the FBCLK signal while frequency divider circuit 206 counts from 1 to 100 one time to generate one period in OUT1. Subsequently, synchronization block 209 resets frequency divider circuit 208 using signal R2. The process then repeats when block 209 causes multiplexer 210 to transmit OUT1 as the FBCLK signal while frequency divider circuit 206 counts from 1 to 100 another 197 times. In this example, frequency divider circuit 208 counts from 1 to 101 to generate each period in signal OUT2.

Figure 4:
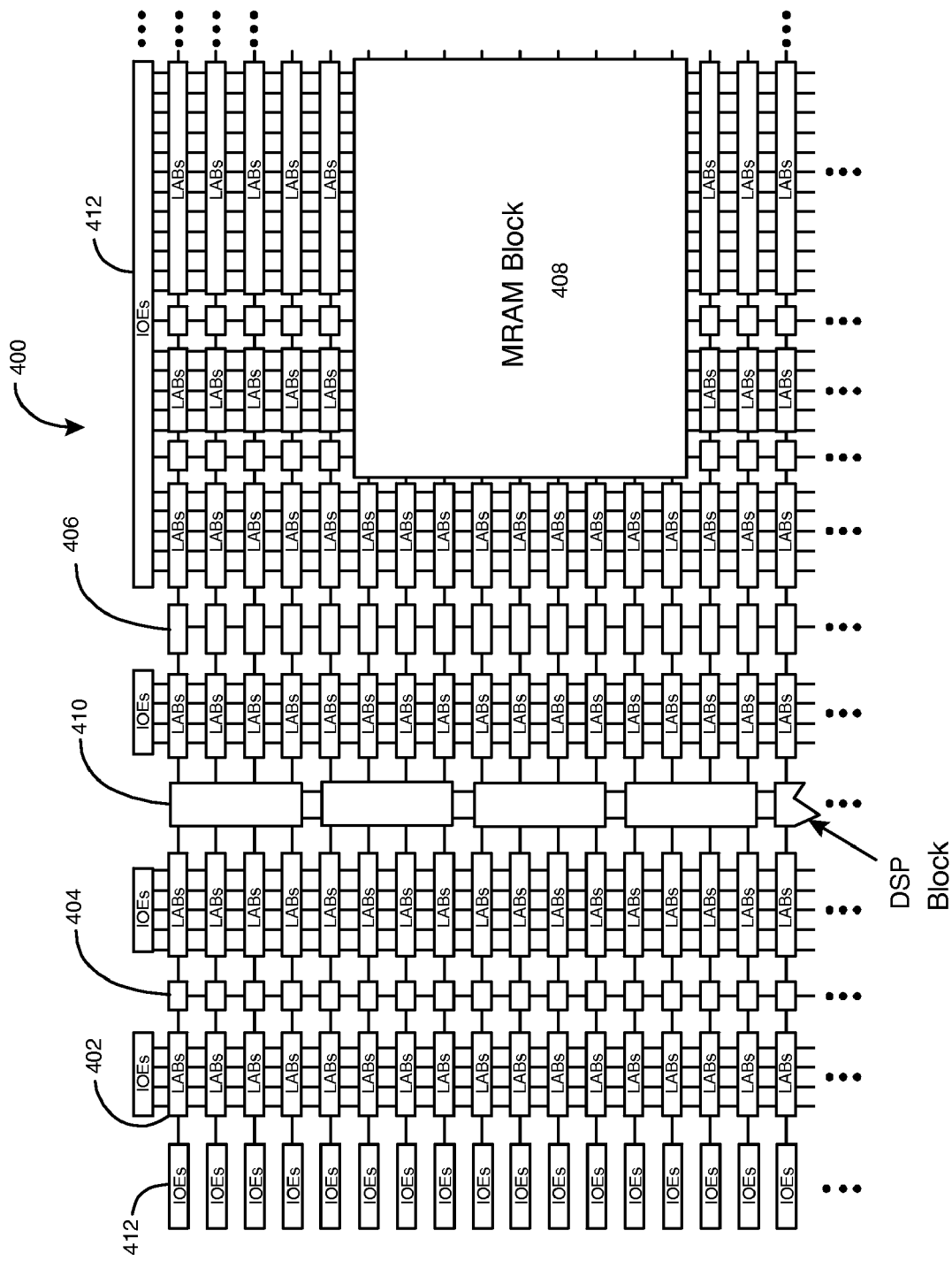
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 located, in this example, around the periphery of the chip, support numerous single-ended and differential input/output standards. IOEs 412 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 400 is described herein for illustrative purposes only and that the present invention can be implemented in many different types of PLDs, FPGAs, and ASICs.

Figure 5:
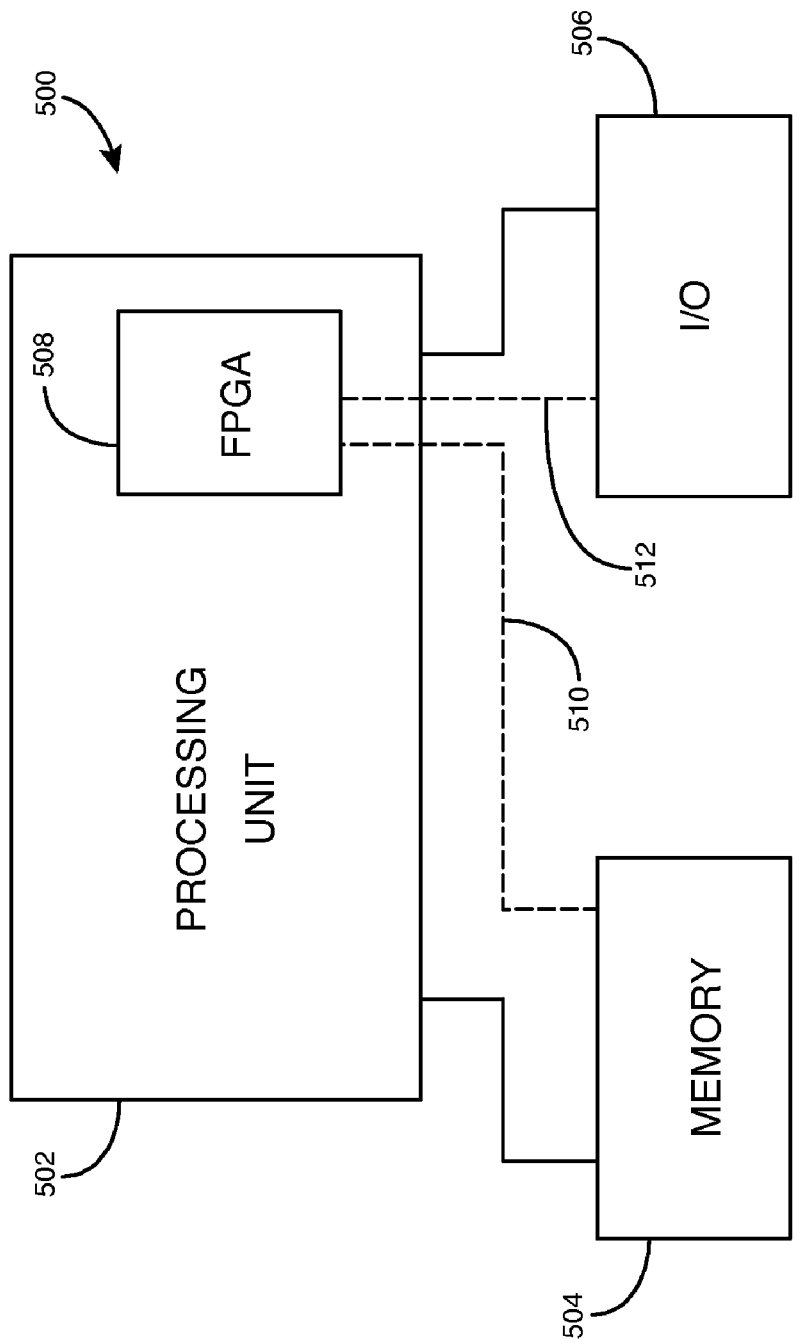
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor, which can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
    phase detection circuitry that compares an input clock signal to a feedback signal to generate a control signal;

a clock signal generation circuit that generates a periodic output signal in response to the control signal;

a first frequency divider that divides a frequency of the periodic output signal by a first value to generate a first frequency divided signal;

a second frequency divider that divides the frequency of the periodic output signal by a second value to generate a second frequency divided signal, wherein the first and the second frequency divided signals are routed to the phase detection circuitry as the feedback signal during different time intervals; and a synchronization block generating a first reset signal that resets the first frequency divider and a second reset signal that resets the second frequency divider.

2. The circuit defined in claim 1 wherein the first frequency divided signal is routed to the phase detection circuitry as the feedback signal during a first portion of each period of a select signal, and the second frequency divided signal is routed to the phase detection circuitry as the feedback signal during a second portion of each period of the select signal.

3. The circuit defined in claim 2 further comprising:
a third frequency divider that divides a frequency of the first frequency divided signal by a third value to generate a third frequency divided signal; and
a multiplexer that routes the first frequency divided signal to the phase detection circuitry as the feedback signal during the first portion of each period of the select signal, and that routes the second frequency divided signal to the phase detection circuitry as the feedback signal during the second portion of each period of the select signal,
wherein the third frequency divided signal is used to generate the select signal, and the select signal is transmitted to a select input terminal of the multiplexer.

4. The circuit defined in claim 3 wherein the synchronization block generates the select signal in response to the third frequency divided signal to prevent glitches in the feedback signal when the multiplexer switches between the first and the second frequency divided signals.

5. The circuit defined in claim 3 further comprising:
a fourth frequency divider that divides a frequency of a reference clock signal to generate the input clock signal.

6. The circuit defined in claim 2 wherein the phase detection circuitry comprises a phase frequency detector, a charge pump coupled to the phase frequency detector, and a loop filter coupled to the charge pump.

7. The circuit defined in claim 6 wherein the circuit is a phase-locked loop, the clock signal generation circuit is an oscillator circuit, and an average frequency of the periodic output signal is determined by the first value, the second value, and a duty cycle of the select signal.

8. The circuit defined in claim 1 wherein the circuit is a phase-locked loop, and the clock signal generation circuit is an oscillator circuit.

9. The circuit defined in claim 1 wherein the circuit is fabricated on a programmable logic integrated circuit, and the first and the second frequency dividers are implemented by programmable logic blocks.

10. A method for generating a clock signal, the method comprising:
comparing an input clock signal to a feedback clock signal to generate a control signal;
generating an output clock signal in response to the control signal;
dividing a frequency of the output clock signal by a first value to generate a first frequency divided signal;

dividing the frequency of the output clock signal by a second value to generate a second frequency divided signal;
routing the first and the second frequency divided signals as the feedback clock signal during alternating time intervals;
generating a first reset signal that defines a period of the first frequency divided signal; and
generating a second reset signal that defines a period of the second frequency divided signal.

11. The method defined in claim 10 further comprising:
dividing a frequency of the first frequency divided signal by a third value to generate a third frequency divided signal,
wherein routing the first and the second frequency divided signals as the feedback clock signal during alternating time intervals further comprises routing the first frequency divided signal as the feedback clock signal during a first portion of each period of a select signal, and routing the second frequency divided signal as the feedback clock signal during a second portion of each period of the select signal, wherein the third frequency divided signal is used to generate the select signal.

12. The method defined in claim 11 wherein a duty cycle of the select signal is set to (C−1)/C, and wherein C is an integer.

13. The method defined in claim 11 wherein an average frequency of the output clock signal is determined by the first value, the second value, and a duty cycle of the select signal.

14. The method defined in claim 10 further comprising:
dividing a frequency of a reference clock signal to generate the input clock signal.

15. The method defined in claim 10 wherein generating the output clock signal in response to the control signal further comprises generating the output clock signal using an oscillator.

16. A locked loop comprising:
phase detection circuitry that compares an input clock signal to a feedback clock signal to generate a control signal;
a clock signal generation circuit generating an output clock signal in response to the control signal,
wherein the locked loop is configured to divide a frequency of the output clock signal by a first value to generate a first frequency divided signal that is provided as the feedback clock signal during a first portion of each period of a select signal, and
wherein the locked loop is configured to divide the frequency of the output clock signal by a second value to generate a second frequency divided signal that is provided as the feedback clock signal during a second portion of each period of the select signal; and
a synchronization block generating a first reset signal that defines a period of the first frequency divided signal and a second reset signal that defines a period of the second frequency divided signal.

17. The locked loop defined in claim 16 wherein an average frequency of the output clock signal is determined by the first value, the second value, and a duty cycle of the select signal, and the first and the second values are different values.

18. The locked loop defined in claim 16 further comprising:
a first frequency divider circuit configured to divide the frequency of the output clock signal by the first value to generate the first frequency divided signal; and
a second frequency divider circuit configured to divide the frequency of the output clock signal by the second value to generate the second frequency divided signal.

19. The locked loop defined in claim 18 further comprising:
a third frequency divider circuit configured to divide a frequency of the first frequency divided signal by a third value to generate a third frequency divided signal that is used to generate the select signal.

20. The locked loop defined in claim 18 wherein the synchronization block generates the first reset signal to reset the first frequency divider circuit and the second reset signal to reset the second frequency divider circuit.

21. The locked loop defined in claim 16 wherein the locked loop causes the average frequency of the output clock signal to equal a frequency of the input clock signal multiplied by a non-integer number for a selected fixed frequency of the input clock signal.

22. The locked loop defined in claim 16 wherein the locked loop is a phase-locked loop, and the clock signal generation circuit is an oscillator circuit.

23. A loop circuit comprising:
phase detection circuitry that compares a varying input signal to a varying feedback signal to generate a control signal;
a signal generation circuit generating a varying output signal in response to the control signal, wherein the loop circuit divides a frequency of the varying output signal by a first value to generate a first frequency divided signal, and the loop circuit divides the frequency of the varying output signal by a second value to generate a second frequency divided signal, wherein the loop circuit generates a select signal;
a synchronization circuit generating a first reset signal that defines a period of the first frequency divided signal and a second reset signal that defines a period of the second frequency divided signal; and
a multiplexer that routes the first frequency divided signal to the phase detection circuitry as the varying feedback signal during a first portion of each period of the select signal, and that routes the second frequency divided signal to the phase detection circuitry as the varying feedback signal during a second portion of each period of the select signal.

\* \* \* \* \*